United States Patent [19]
Rutter et al.

[11] Patent Number: 5,183,769
[45] Date of Patent: Feb. 2, 1993

[54] VERTICAL CURRENT FLOW SEMICONDUCTOR DEVICE UTILIZING WAFER BONDING

[75] Inventors: Robert E. Rutter, Tempe; Frank S. d'Aragona, Scottsdale, both of Ariz.

[73] Assignee: Motorola, Inc., Schaumburg, Ill.

[21] Appl. No.: 696,405

[22] Filed: May 6, 1991

[51] Int. Cl.$^5$ .................................. H01L 29/70
[52] U.S. Cl. ........................... 437/31; 437/29; 437/974; 437/6; 148/DIG. 12; 148/DIG. 135; 257/341; 257/684
[58] Field of Search ............... 437/974, 29, 31; 357/23.4; 148/DIG. 135, DIG. 12

[56] References Cited

U.S. PATENT DOCUMENTS

| | | | |
|---|---|---|---|
| 4,738,935 | 4/1988 | Shimobo et al. | 437/31 |
| 4,826,787 | 5/1989 | Nuto et al. | 437/208 |
| 5,023,696 | 6/1991 | Ogimo | 357/23.4 |

FOREIGN PATENT DOCUMENTS

| | | | |
|---|---|---|---|
| 0327316 | 8/1989 | European Pat. Off. | 357/23.4 |
| 0208268 | 9/1986 | Japan | 357/23.4 |
| 1-226168 | 9/1989 | Japan | 437/974 |
| 2122420 | 1/1984 | United Kingdom | 437/29 |

*Primary Examiner*—Olik Chaudhuri
*Assistant Examiner*—Long Pham
*Attorney, Agent, or Firm*—Joe E. Barbee

[57] ABSTRACT

An intermediate contact layer (16) is created within a vertical current flow semiconductor device such as an enhanced insulated gate bipolar transistor (EIGBT) (17). An active wafer (11) that is used for forming active elements of the device is wafer bonded to a conductor (16) that is on a surface of a substrate wafer (12). The wafer bonding not only forms the intermediate contact layer (16) but also diffuses a series of P (18) and N (19) regions into the active wafer (11) thereby forming ohmic contacts between the P (18) and N (19) regions and the intermediate contact layer (16). The substrate wafer (12) provides support for the active wafer (11) during subsequent wafer processing operations.

12 Claims, 1 Drawing Sheet

VERTICAL CURRENT FLOW SEMICONDUCTOR DEVICE UTILIZING WAFER BONDING

BACKGROUND OF THE INVENTION

The present invention relates, in general, to semiconductor devices, and more particularly, to a novel method of manufacturing a vertical current flow semiconductor device.

In recent years, a class of power semiconductor devices typically referred to as an insulated gate bipolar transistor (IGBT) had been developed by the semiconductor industry. Of particular interest had been an enhanced insulated gate bipolar transistor (EIGBT).

Previous methods for creating enhanced insulating gate bipolar transistors (EIGBTs) typically involved forming a series of P and N regions in a checkerboard pattern on one surface of a semiconductor wafer, growing an epitaxial layer to cover the P and N regions, and diffusing a field effect transistor structure in the epitaxial region above the P and N areas. The EIGBT's drain electrode was a conductor that electrically connected the P and N regions. The drain electrode was created by first removing material from the wafer surface opposite the P and N regions until the P and N regions were exposed. Then the drain electrode was formed by covering the exposed P and N regions with a conductor. Because a large amount of material had to be removed from the wafer before the P and N regions were exposed, the resulting wafer typically had a thickness of approximately 100 to 130 microns. Such thin wafers were difficult to handle in a wafer processing area and resulted in a high incidence of wafer breakage thereby increasing the EIGBT's cost. To ensure that the removal procedures did not inadvertently obliterate the P and N regions, the regions typically were formed with a thickness of approximately 50 microns. Formation of such deeply diffused regions required diffusing at temperatures of approximately 1250 degrees centigrade for approximately 50 hours which resulted in a high manufacturing cost. Additionally, the removal operations utilized to expose the P and N regions had wide tolerances that resulted in non-uniform thickness of the P and N areas. The P and N thickness variations resulted in EIGBTs that had widely varying operating characteristics such as source-drain voltage drop, maximum drain current, and turn-off time.

Accordingly, it is desirable to have a method for producing EIGBTs that uses thick wafers that are easy to handle, that has a low manufacturing cost, and that results in EIGBTs with consistent operating characteristics.

SUMMARY OF THE INVENTION

Briefly stated, the present invention utilizes wafer bonding to create an intermediate contact layer within a vertical current flow semiconductor device such as an enhanced insulated gate bipolar transistor (EIGBT). An active wafer that is used for forming active elements of the device is wafer bonded to a conductor that is on a surface of a substrate wafer. The conductor forms the intermediate contact layer which is an ohmic contact within the EIGBT. The high temperature of the wafer bonding operation diffuses dopants into the active wafer which form a series of P and N regions that provide ohmic contacts to the intermediate contact layer. The substrate wafer provides support for the active wafer during subsequent wafer processing operations.

DETAILED DESCRIPTION OF THE DRAWINGS

An enhanced insulated gate bipolar transistor (EIGBT) is formed by wafer bonding an active wafer to a conductor that is on a surface of a substrate wafer. Wafer bonding the conductor to the active wafer facilitates creating the vertical current flow device with a thickness that is suitable for handling during subsequent wafer processing operations, and with operating characteristics that are consistent between devices.

While the invention is described with specific preferred embodiments, it is evident that many alternatives and variations will be apparent to those skilled in the semiconductor arts. More specifically the invention is hereinafter described for a particular N-channel enhanced insulated gate bipolar transistor (EIGBT) structure, although the method is directly applicable to P-channel EIGBTs, as well as to diodes and other vertical current flow semiconductor devices.

Figure 1:
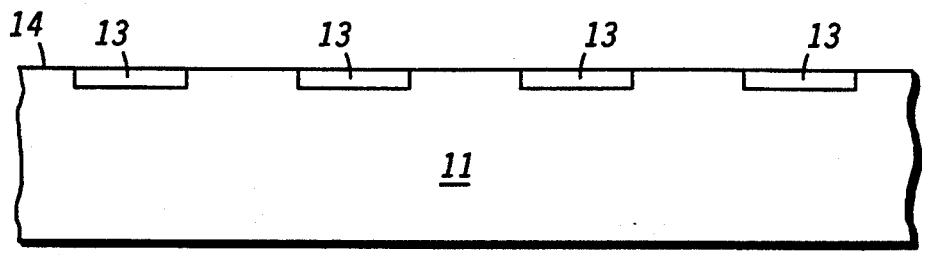
FIG. 1 is an enlarged portion of a cross section of an active wafer that can be utilized in forming an enhanced insulated gate bipolar transistor in accordance with the present invention.

Referring to FIG. 1, an N-channel EIGBT typically includes a lightly doped N-type active wafer 11. A series of P-type predeposition areas 13 are formed by applying high concentrations of P-type dopants to a surface 14 of active wafer 11. The dopants in predeposition areas 13 will subsequently be diffused further into active wafer 11 to form heavily doped P-type regions. P-type areas 13 generally form a checkered or mosaic pattern in active wafer 11 and are separated a distance approximately equal to the width of each area 13.

Figure 2:
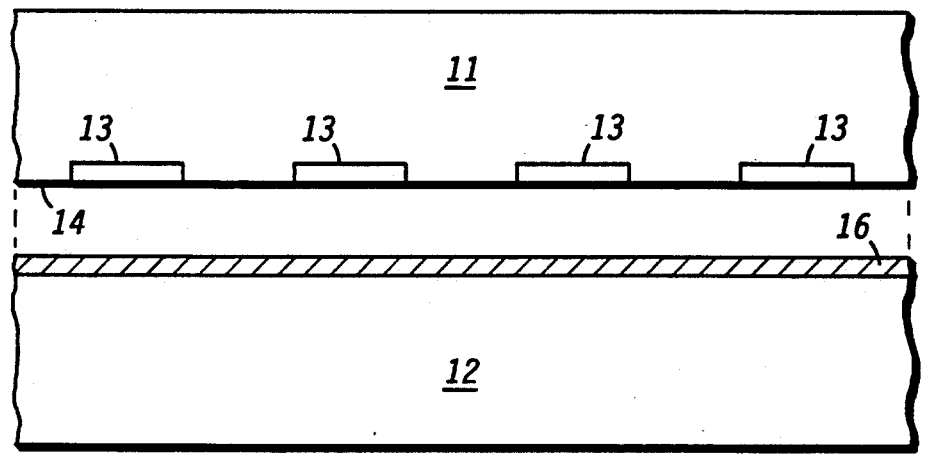
FIG. 2 is an enlarged portion of an exploded cross section of an embodiment of an enhanced insulated gate bipolar transistor at a stage of manufacturing in accordance with the present invention.

FIG. 2 illustrates an exploded view of a portion of active wafer 11 shown in FIG. 1 and a substrate wafer 12 prior to wafer bonding substrate 12 to active wafer 11. A conductor 16 that is on a surface of substrate wafer 12 is placed in contact with surface 14 of active wafer 11 and bonded to surface 14 by a process such as that disclosed in U.S. Pat. No. 4,826,787 issued to Muto et al on May 2, 1989 and is hereby incorporated herein by reference. To facilitate the wafer bonding, conductor 16 is a refractory metal that functions as a wafer bonding adhesive thereby permitting substrate 12 to be bonded and firmly attached to active wafer 11. In one embodiment, conductor 16 is tungsten. After bonding is complete, substrate 12 functions as a support for active wafer 11 and simplifies the handling of active wafer 11. Substrate 12 has a thickness that ensures active wafer 11 is not damaged during subsequent processing steps. Additionally, substrate 12 will form a portion of the EIGBT's vertical current flow path therefore it is highly doped to provide a low resistance. In the preferred embodiment, substrate 12 is a highly doped N- type wafer that has a thickness between three hundred and four hundred fifty microns.

Figure 3:
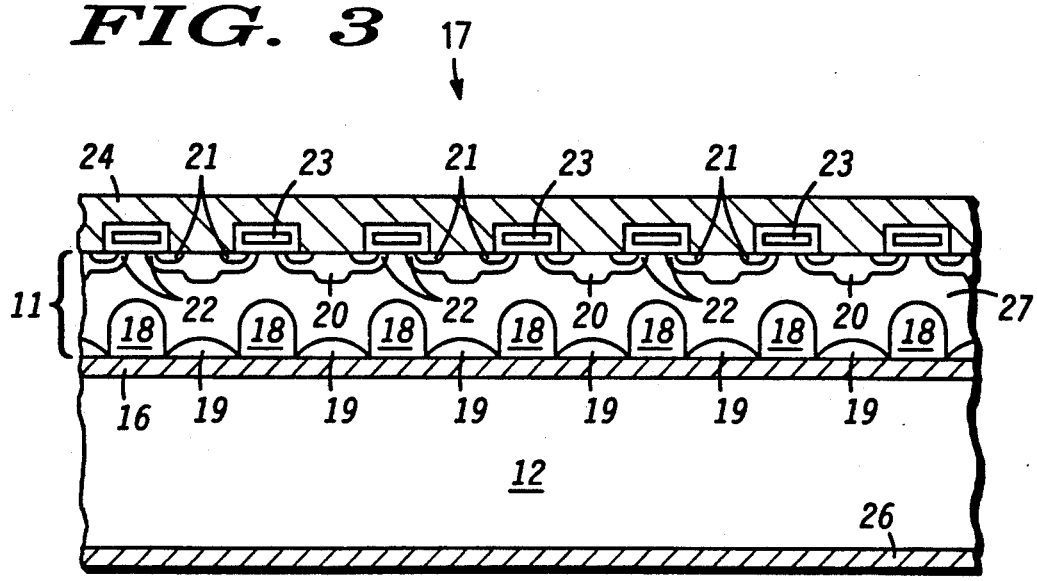
FIG. 3 is an enlarged cross sectional portion of an embodiment of an enhanced insulated gate bipolar transistor at a subsequent stage of manufacturing in accordance with the present invention.

Referring to FIG. 3, an EIGBT 17 has P-type regions 18 that are created as the elevated temperature of the wafer bonding process diffuses the dopants of predeposition areas 13 shown in FIG. 1 further into active wafer 11. Since the present method does not require surface 14 of active wafer 11 to be thinned as is required with previous techniques, the thickness of P-type regions 18 only has to be sufficient to form a P-N junction with active wafer 11. In the preferred embodiment, P-type regions 18 have a depth into active wafer 11 of ten microns or less. The wafer bonding process's elevated temperature also transforms conductor 16 into a refractory metal silicide by diffusing silicon from active wafer 11 and substrate 12 into conductor 16. During the formation of this refractory metal silicide, N-type dopants from heavily doped substrate 12 are transported across conductor 16 and form heavily doped N-type areas 19. These N-type areas 19 are needed to form an ohmic contact between conductor 16 and active wafer 11 and to improve the low current characteristics of EIGBT 17. In this configuration, conductor 16 functions as an intermediate contact layer that is within the structure of EIGBT 17. Wafer bonding substrate 12 to active wafer 11 not only provides an intermediate contact layer that forms ohmic contact to P-type regions 18 and to N-type regions 19, it also diffuses regions 18 and 19 into active wafer 11. Consequently, the expensive fifty hour diffusion operation required by previous methods of forming EIGBTs is not required by the current method. As N-type dopants diffuse across conductor 16 and form N-type regions 19, the dopants also diffuse into P-type areas 18 counter doping P-type areas 18. Consequently, it is important that the N-type dopants used in substrate 12 are slow diffusing dopants, such as antimony, in order to minimize counter doping of P-type regions 18.

In an alternate embodiment, diffusing of dopants from substrate 12 into wafer 11 during the wafer bonding step can be eliminated by utilizing a diffusion barrier material for conductor 16, that is a material that blocks dopant diffusion. Titanium is one such material that blocks the diffusion of dopants and can be used for a diffusion barrier. Conductor 16 could be titanium or a combination of refractory materials such as tungsten mixed with titanium, or tungsten and titanium nitride, or other combinations which are conductors that form a diffusion barrier which can also be a wafer bonding adhesive layer. Alternately, conductor 16 could have a layered construction with a diffusion barrier layer such as titanium on substrate 12 to prevent dopant diffusion, and a wafer bonding adhesive layer such as tungsten covering the diffusion barrier layer. With the use of a diffusion barrier layer, both N-type and P-type dopants would be predeposited onto wafer 11, as described in FIG. 1, and diffused into wafer 11 by the wafer bonding step.

Before the remaining elements of EIGBT 17 are formed, the breakdown voltage of EIGBT 17 is established by thinning the top surface of active wafer 11 with conventional polishing or grinding techniques to a thickness that provides the desired breakdown voltage. In the preferred embodiment, active wafer 11 is approximately 80 microns thick which provides a breakdown voltage of approximately 400 volts. Since active wafer 11 is supported by substrate 12, active wafer 11 can be thinned even further to provide other EIGBT structures with lower breakdown voltage. Previous methods of forming EIGBTs did not provide a support such as substrate 12, consequently it was difficult to obtain EIGBTs with low breakdown voltages. After active wafer 11 has been thinned, a field effect transistor that includes source regions 21, channel regions 22, gates 23, base regions 20, and a source electrode 24 is formed in the exposed surface of active wafer 11. Each gate 23 is covered by a dielectric that isolates each gate 23 from source electrode 24. A drain region 27 is created by the remaining portion of active wafer 11 that is between regions 18 and 19, and base regions 20. A drain electrode 26 is applied to the bottom surface of substrate 12 to complete the structure of EIGBT 17. EIGBT 17 is a vertical current flow device that has current flow from source electrode 24, through source regions 21, channel regions 22, drain region 27, buried contact layer 16, and substrate 12 to drain electrode 26. P-type regions 18 function as minority carrier injectors that improve the high current operation of EIGBT 17 and also provide a rectifying path for current flow between conductor 16 and active wafer 11 when EIGBT 17 is reverse biased. During low current operation, N-type areas 19 shunt the minority carrier injectors and provide EIGBT 17 with improved performance relative to conventional IGBT structures.

The technique of utilizing wafer bonding to provide a support substrate that has an intermediate contact layer can also be used to form high performance diodes and other vertical current flow semiconductor devices. Some high performance diodes utilize a series of adjacent P and N regions, similar to regions 18 and 19 of EIGBT 17, to enhance the switching characteristics of the diode. Another similar diode structure only has P-type regions 19 with N-type regions 18 replaced by Schottky regions. The wafer bonding method described in FIG. 1 through FIG. 3 can also be utilized to create these high performance diodes in addition to other vertical current flow devices.

By now it should be appreciated that there has been provided a novel way to fabricate vertical current flow devices and particularly an enhanced insulated gate bipolar transistor. Creating an intermediate contact layer by wafer bonding a conductor onto an active wafer facilitates forming shallow P and N regions in the active wafer thereby eliminating the long and expensive diffusions of previous methods and reducing the EIGBT's manufacturing cost. Utilizing the intermediate contact layer to form ohmic contacts to the P and N regions eliminates thickness variations of the P and N regions thereby providing EIGBTs having consistent characteristics such as source to drain voltage drop, maximum drain current, and turn-off time. The substrate that is wafer bonded to the active wafer provides mechanical support that substantially eliminates wafer breakage during the EIGBT's manufacturing operations thereby further reducing the EIBGT's manufacturing costs.

We claim:

1. A method of manufacturing an enhanced insulated gate bipolar transistor (EIGBT) comprising:
   providing an active wafer that is a lightly doped semiconductor wafer of a first conductivity type having a first surface and a second surface;
   pre-depositing dopant of a second conductivity type in predetermined regions on the first surface of the active wafer;

providing a substrate that is a highly doped semiconductor wafer of the first conductivity type having a first surface and a second surface;

depositing a wafer bonding adhesive layer onto a first surface of the substrate;

attaching the first surface of the active wafer to the wafer bonding adhesive layer by using a wafer bonding procedure that facilitates diffusing the pre-deposited dopant a predetermined distance into the active wafer;

thinning the active wafer by removing a predetermined amount from the second surface of the active wafer;

forming source and channel areas of a field effect transistor in the second surface of the active wafer; and depositing a drain electrode onto a second surface of the substrate.

2. The method of claim 1 wherein depositing the wafer bonding adhesive layer includes depositing a refractory metal layer.

3. The method of claim 1 wherein depositing the wafer bonding adhesive layer includes depositing a layer of tungsten.

4. The method of claim 1 wherein the attaching the first surface step includes diffusing the pre-deposited dopant that is in a checkered pattern approximately 10 microns into the active wafer, and diffusing a dopant of the first conductivity type from the substrate a predetermined distance into the first surface of the active wafer.

5. The method of claim 4 wherein diffusing the dopant of the first conductivity type from the substrate includes diffusing antimony from the substrate.

6. The method of claim 1 wherein the thinning the active wafer step includes removing an amount of material from the active wafer that results in the active wafer having a thickness of approximately 80 microns.

7. A method of forming a vertical current flow semiconductor device that has a minority carrier injection diode comprising:

providing an active wafer of a first conductivity type having a first surface and a plurality of predeposited dopant regions on a second surface of the active wafer;

providing a substrate having a wafer bonding adhesive layer on a first surface of the substrate;

forming an intermediate contact layer by wafer bonding the adhesive layer to the second surface of the active wafer wherein the wafer bonding facilitates forming the minority carrier injector diodes by diffusing the predeposited dopants into the second surface of the active wafer; and forming an ohmic contact to the second surface of the substrate.

8. The method of claim 7 wherein providing the substrate having the wafer bonding adhesive layer includes providing the substrate having the wafer bonding adhesive layer that also forms a diffusion barrier.

9. The method of claim 7 wherein providing the substrate having the wafer bonding adhesive layer includes providing the substrate having a diffusion barrier layer that is covered by the wafer bonding adhesive layer.

10. The method of claim 7 wherein the providing an active wafer step includes predepositing dopants of a second conductivity type in a predetermined pattern on the second surface of the active wafer.

11. The method of claim 7 further including forming at least source and channel regions of a field effect transistor on the first surface of the active wafer wherein the vertical current flow semiconductor device forms an enhanced insulated gate bipolar transistor (EIGBT).

12. The method of claim 7 wherein the providing a substrate step includes providing a substrate having a refractory metal layer on a first surface of the substrate.

* * * * *